United States Patent

Hosomi et al.

[11] 4,052,738
[45] Oct. 4, 1977

[54] STYLUS FOR CAPACITIVE VIDEODISC

[75] Inventors: Fumio Hosomi, Moriguchi; Kiyotaka Wasa, Nara; Shigeru Eayakawa, Hirakata; Takeshi Nagai, Neyagawa, all of Japan

[73] Assignee: Matsushita Electric Industrial Co., Ltd., Japan

[21] Appl. No.: 565,259

[22] Filed: Apr. 4, 1975

[30] Foreign Application Priority Data

Apr. 4, 1974 Japan .................................. 49-38600

[51] Int. Cl.² ............................................. G11B 11/06
[52] U.S. Cl. .............................. 358/128; 179/100.1 B; 179/100.41 G; 274/38; 204/192 C; 338/176
[58] Field of Search .......... 178/6.6 R, 6.6 A, 6.6 DD; 179/100.1 B, 100.41 B, 100.41 G, 100.4 R, 100.4 M; 274/38; 204/192 EC, 192 D, 192 C; 358/128

[56] References Cited

U.S. PATENT DOCUMENTS

| | | | |
|---|---|---|---|
| 3,530,055 | 9/1970 | Maissel | 204/192 C |
| 3,669,860 | 6/1972 | Knowles | 204/192 SP |
| 3,826,877 | 7/1974 | Leedom | 178/6.6 A |
| 3,945,902 | 3/1976 | Hawrylo | 274/38 |

Primary Examiner—Bernard Konick
Assistant Examiner—Alan Faber
Attorney, Agent, or Firm—Wenderoth, Lind & Ponack

[57] ABSTRACT

An alumina body having a conductive coating with a smooth surface, is made up of a conductive layer and a cementing layer sandwiched between the conductive layer and the surface of the alumina. The thus coated alumina body can advantageously be used e.g. for a pickup stylus for a video disc playback system of the capacitance variation type.

3 Claims, 4 Drawing Figures

STYLUS FOR CAPACITIVE VIDEODISC

BACKGROUND OF THE INVENTION

This invention relates to a novel structure of an alumina body having a conductive coating thereon. More particularly, it relates to an alumina body having a conductive coat suitable for making e.g. a pickup stylus for the video disc playback system of a capacitance variation type.

Alumina such as sapphire or ruby the main constituent of which is $\alpha$-$Al_2O_3$, and which has a conductive coating thereon is widely used to make, for instance, a pickup stylus for a video disc playback system of the capacitance variation type or a variable resistor having a thin metal film coating for use in an electrical circuit. The conductive coating, however, is not very adhesive with respect to the alumina because of the high chemical stability of the surface of the alumina. Several attempts have been made to increase the adhesive force of the conductive coat with respect to the alumina. For instance an irregular surfacehas been provided on the alumina to increase the adhesion of the conductive coating to the alumina surface. These aluminas, however, have shortcomings such as the non-uniformity of the cnductive surface coating.

SUMMARY OF THE INVENTION

It is an object of this invention to provide an alumina body having a conductive coating with a smooth surface.

Another object of this invention is to provide an alumina body having a conductive coating suitable for making e.g. a pickup stylus for a video disc playback system of the capacitance variation type.

Still another object of this invention is to provide an alumina body having a conductive coat suitable for making e.g. a variable resistor for an electrical circuit.

These and other objects of this invention will be apparent from the following description taken together with the accompanying drawings, wherein:

DESCRIPTION OF THE PREFERRED EMBODIMENT

Figure 1:
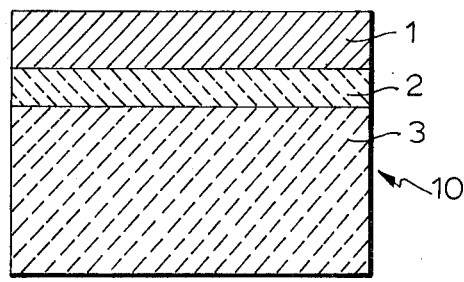
FIGS. 1-2 are cross sectional views of an alumina body having a conductive coating thereon in accordance with this invention.

Referring to FIG. 1, an alumina body having a conductive coating, generally designated by reference numeral 10 according to this invention comprises a conductive layer 1 and a cementing layer 2 sandwiched between the conductive layer and a surface of the alumina body 3. Any available and suitable conductive material can be used for making the conductive layer. For example, an elemental metal, a metal alloy or a metal-nitride compound can be used therefor.

It has been discovered according to this invention that when the cementing layer is made of an oxide of the conductive layer such as the oxide of the elemental metal, the oxide of the metal alloy and the oxide of the metal-nitride compound, the conductive layer will adhere tightly to the surface of the alumina. The adhesive strength of the conductive layer on the alumina measured by a pulling method is higher than 5 kg/mm$^2$.

It has also been discovered according to this invention that when the cementing layer is a multi-layer, the conductive layer adhere much moere tightly to the surface of the alumina.

Figure 2:
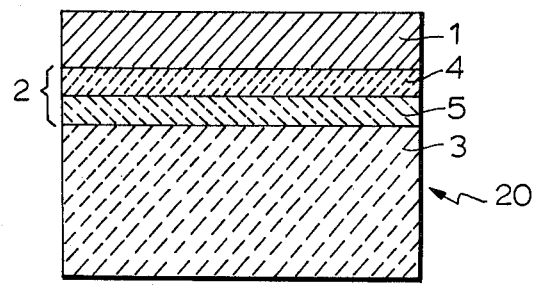

Referring to FIG. 2, an alumina body having a conductive coating generally designated by reference numeral 20 according to this invention comprises a conductive layer 1 and a cementing layer 2 sandwiched between the conductive layer and the surface of the alumina 3. The cementing layer comprises an upper layer portion 4 and a lower layer portion 5, the upper layer being an oxide of the conductive layer and the lower layer being a solid solution of an aluminum metal oxide and a metal oxide of a metal other than alumina the melting temperature of which is lower than that of alumina. The alumina 3 is not restricted to pure alumina crystals or ceramic type alumina. Any crystal or ceramics which are composed of $\alpha$-$Al_2O_3$ is applicable such as sapphire, ruby, star ruby and star sapphire.

It is preferable that the solid solution for the lower layer portion 5 be composed of one member selected from the group consisting of $Al_2O_3$-$SiO_2$, $Al_2O_3$-$GeO_2$, $Al_2O_3$-$SnO_2$, $Al_2O_3$-$PbO$, $Al_2O_3$-$B_2O_3$, $Al_2O_3$-$Ga_2O_3$, $Al_2O_3$-$In_2O_3$ combination of two or more of these solid solutions. The solid solution can soften the surface of alumina so that the conductive layer can be easily cemented onto the surface of alumina. The lower layer portion 5 can also be a solid solution of an alumina and a glass such as a soda glass, a lead glass, a borosilicate glass, for example such as sold under the trademark Pyrex by Corning Glass Works, Corning, New York, or a silica glass, for example such as sold under the trademark Vycor by Corning Glass Works.

Hard metals such as a refractory metal, a nitride such as a refractory metal nitride, a silicide such as a refractory metal silicide, a boride such as a refractory metal boride, a carbide such as a refractory metal carbide, and compounds thereof can be used for making the conductive layer when a high wear resistance is required for the conductive layer. The adhesive strength of the conductive layer on the alumina measured by a pulling method is found to be much higher than 5 kg/mm$^2$.

The conductive layer and the cementing layer described hereinbefore can be made by using a conventional cathodic sputtering technique: the conductive layer can be made by RF cathodic sputtering from a target of the conductive material for the conductive layer in a non-reactive atmosphere such as an argon gas atmosphere at a pressure of $10^{-2}$ to $10^{-1}$ Torr. The cementing layer composed of the oxide of the conductive layer can be made by RF cathodic sputtering from a target of the conductive material in an oxidizing atmosphere such as an oxygen gas temperature at a pressure of $10^{-2}$ to $10^{-1}$ Torr. The cementing layer composed of the solid solution can be made by RF cathodic sputtering from a target of the metal oxide other than alumina or a target of the glass described hereinbefore in a non-reactive atmosphere such as an argon gas atmosphere followed by heat treating in air at 600° to 1200° C for 1 to 3 hours.

Figure 3:
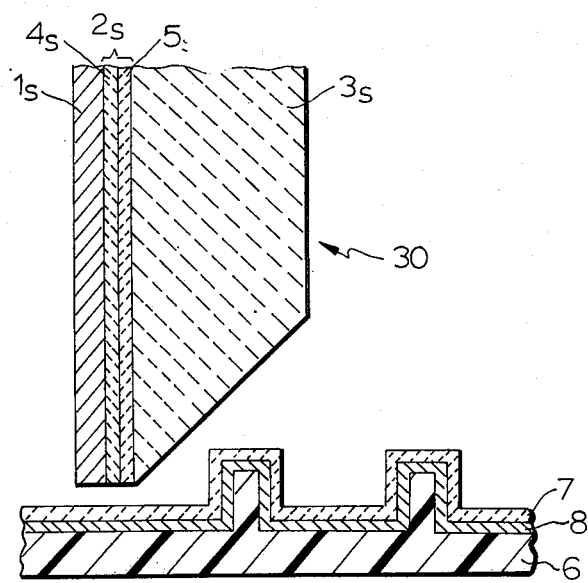
FIG. 3 is a cross sectional view of a pickup stylus for a video disc playback system of the capacitance variation type which is made of an alumina body having a conductive coating thereon in accordance with this invention.

It has been found that an alumina pickup stylus for a video disc playback system of the capacitance variation type can be made from an elongated bar of alumina having a conductive coating described hereinbefore. Referring to FIG. 3, a pickup stylus generally indicated at 30 for a video disc playback system in accordance with this invention comprises an elongate bar 3 of alumina such as a sapphire crystal bar, a conductive layer 1s having a high wear resistance comprising a tantalum and cementing layer 2s comprising a tantalum oxide layer portion 4s and a solid solution layer portion 5s of $Al_2O_3$-$SiO_2$. The thickness of the tantalum, the tantalum oxide and the solid solution $Al_2O_3$-$SiO_2$ is preferably 0.05 to 1.0, 0.01 to 0.2 and 0.01 to 0.3 μm, respectively. Referring again to FIG. 3, the pickup stylus 30 is adapted to track in a groove in a recording disc 6 having a conductive surface 7 and a dielectric coating 8 over said conductive surface, and further adapted to cooperate with said recording disc to provide capacitive variations between said stylus and said conductive surface due to geometrical variations in the bottom of the groove when relative motion is established between said stylus and said recording disc. Any conductive material having a high wear resistance can be used for making the conductive layer 1 of the stylus. A refractory metal such as Ta, Hf, Ti, Zr, Nb, Mo and ally thereof, a refractory metal nitride such as tantalum nitride, hafnium nitride, titanium nitride, zirconium nitride, niobium nitride, molybdenum nitride and compounds thereof, a refractory metal silicide such as tantalum silicide, hafnium silicide, titanium silicide, zirconium silicide, niobium silicide, molybdenum silicide and compounds thereof, a refractory metal boride such as tantalum boride, hafnium boride, titanium boride, zirconium boride, niobium boride, molybdenum boride and compounds thereof, and a refractory metal carbide such as tantalum carbide, hafnium carbide, titanium carbide, zirconium carbide, niobium carbide, molybdenum carbide and compounds thereof, can be used for the conductive layer 1. The alumina bar 3 is shaped in such a manner that when it engages the record disc groove, an edge of the conductive element is adjacent the dielectric coating.

Figure 4:
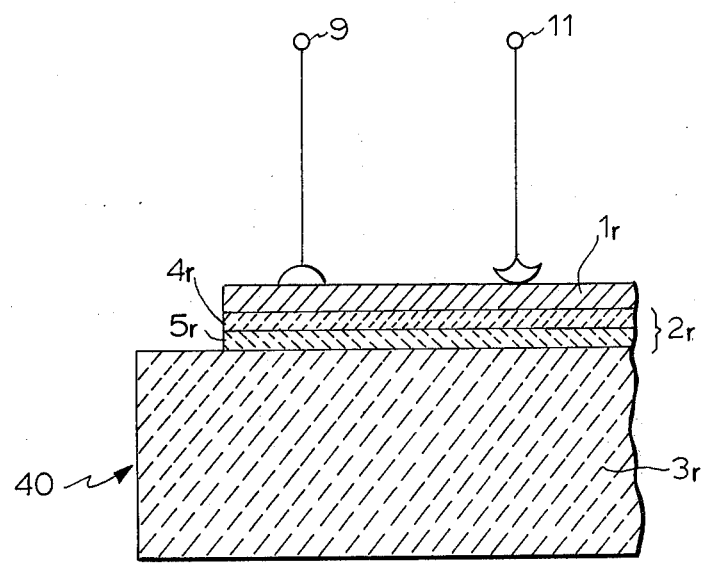
FIG. 4 is a cross sectional view of a variable resistor which is made of an alumina body havng a conductive coating thereon in accordance with this invention.

It has also been discovered according to this invention that a variable resistor having a thin resistive film for use in an electrical circuit can be made by using an alumina body having a conductive coat such described hereinbefore. Referring to FIG. 4, a variable resistor 40 in accordance with this invention comprises a base substrate 3r made of alumina ceramic having a smooth surface, a conductive coating 1r made of a resistive film, a cementing layer 2r comprising an oxide layer 4r of said resistive film 4 and a solid solution layer 5r of a solid solution such as $Al_2O_3$-$SiO_2$, a fixed metal electrode 9 and a movable metal brush electrode 11 contacting the surface of said conductive coat. Any resistive material can be used for making the conductive coating if the conductive coating has a high wear resistance. A hard metal such as Ta, Hf, Ti, Zr, Nb or, Mo and alloys thereof, a metal-nitride compound such as tantalum nitride, hafnium nitride, titanium nitride, zirconium nitride, niobium nitride and molybdenum nitride, tantalum-tantalum nitride, tantalum-silicon nitride and tantalum-aluminum nitride, and compounds of nitride such as tantalum nitride-silicon nitride, titanium nitride-aluminum nitride, titanium nitride-zirconium nitride-aluminum nitride, can be used for making the conductive coat.

It is thought that this invention and its advantages will be understood from the foregoing description.

What is claimed is:

1. A pick-up stylus for tracking in a groove in a recording disk having a conductive surface and a dielectric coating over said conductive surface for cooperating with said recording disk to provide capacitive variations between said stylus and said conductive surface when relative motion is established between said stylus and said recording disk, said stylus comprising an elongated bar of alumina having a conductive coating thereon, said coating comprising a conductive layer and a cementing layer sandwiched between said conductive layer and the surface of said alumina bar, said cementing layer comprising an upper layer portion facing said conductive layer and a lower layer portion facing said alumina bar, said upper layer portion being an oxide of a material of said conductive layer and said lower layer portion being a solid solution of alumina and an oxide of a metal other than aluminum, the melting temperature of which is lower than the alumina, said solid solution being a member selected from the group consisting of $Al_2O_3$-$SiO_2$, $Al_2O_3$-$GeO_2$, $Al_2O_3$-$SnO_2$, $Al_2O_3$-$PbO$, $Al_2O_3$-$B_2O_3$, $Al_2O_3$-$Ga_2O_3$, $Al_2O_3$-$In_2O_3$ and combinations thereof, alumina-soda glass, alumina-lead glass, alumina-borosilicate glass, alumina-silica glass, alumina-pyrex glass and alumina-vycor glass, said conductive layer being a member selected from the group consisting of a metal, a metal nitride, a metal silicide, a metal boride, a metal carbide and combinations thereof.

2. A pickup stylus as claimed in claim 1 in which said conductive layer member is refractory.

3. A pickup stylus as claimed in claim 2 in which said conductive layer is one member selected from the group consisting of Ta, Hf, Ti, Zr, Nb, Mo and alloys thereof, tantalum nitride, titanium nitride, zirconium nitride, niobium nitride, molybdenum nitride, tantalum-tantalum nitride, hafnium-hafnium nitride, titanium-titanium nitride, zirconium-zirconium nitride, niobium-niobium nitride, molybdenum-molybdenum nitride, tantalum nitride-titanium nitride, titanium nitride-zirconium nitride, tantalum nitride-aluminum nitride, tantalum nitride-silicon nitride, titanium nitride-aluminum nitride, titanium nitride-silicon nitride and titanium nitride-zirconium nitride-aluminum nitride.

* * * * *